(12) United States Patent
Oh

(10) Patent No.: US 6,620,685 B2
(45) Date of Patent: Sep. 16, 2003

(54) METHOD FOR FABRICATING OF SEMICONDUCTOR MEMORY DEVICE HAVING A METAL PLUG OR A LANDING PAD

(75) Inventor: Jae-Hee Oh, Seoul (KR)

(73) Assignee: Samsung Electronics, Co., LTD, Suwon (KR)

( * ) Notice: Subject to any disclaimer, the term of this patent is extended or adjusted under 35 U.S.C. 154(b) by 0 days.

(21) Appl. No.: 10/096,772

(22) Filed: Mar. 13, 2002

(65) Prior Publication Data

US 2002/0149977 A1 Oct. 17, 2002

(30) Foreign Application Priority Data

Mar. 13, 2001 (KR) ........................................ 2001-12857

(51) Int. Cl.[7] .............................................. H01L 21/336
(52) U.S. Cl. ........................ 438/257; 438/238; 438/239; 438/241
(58) Field of Search ................. 438/238, 239, 438/241–244, 250, 253, 255, 379, 386, 387, 393, 396, 398, 399, 257; 257/295–313

(56) References Cited

U.S. PATENT DOCUMENTS 6,143,601 A    11/2000   Sun
6,258,649 B1 * 7/2001    Nakamura et al. .......... 438/238
6,329,681 B1 * 12/2001   Nakamura et al. .......... 257/297

* cited by examiner

Primary Examiner—David Nelms
Assistant Examiner—Long Tran
(74) Attorney, Agent, or Firm—F. Chau & Associates, LLP

(57) ABSTRACT

Method of fabricating a semiconductor memory device includes the steps of: forming a gate electrode on a silicon substrate; forming a first inter-layer dielectric layer (ILD1) on the silicon substrate; forming a cell pad poly between the gate electrodes in the cell area; forming a direct-contact plug (DC) on the cell pad poly in the cell area, and a first landing stud on the gate in the peripheral area; forming a bit line on the DC in the cell area and a second landing stud on the first landing stud; forming a second inter-layer dielectric layer (ILD2) on the ILD1; forming a silicon nitride layer on the ILD2; patterning the silicon nitride layer; simultaneously etching out a portion of the ILD2 in the cell area and a portion of the ILD2 and a portion of the ILD1 in the peripheral area; and simultaneously forming a plurality of buried contact plugs in the cell area and a first metal contact plug in the peripheral area.

14 Claims, 4 Drawing Sheets

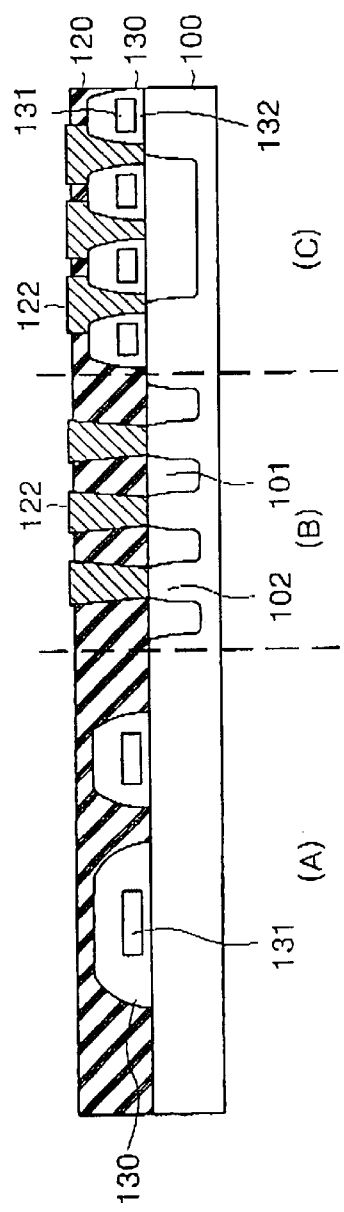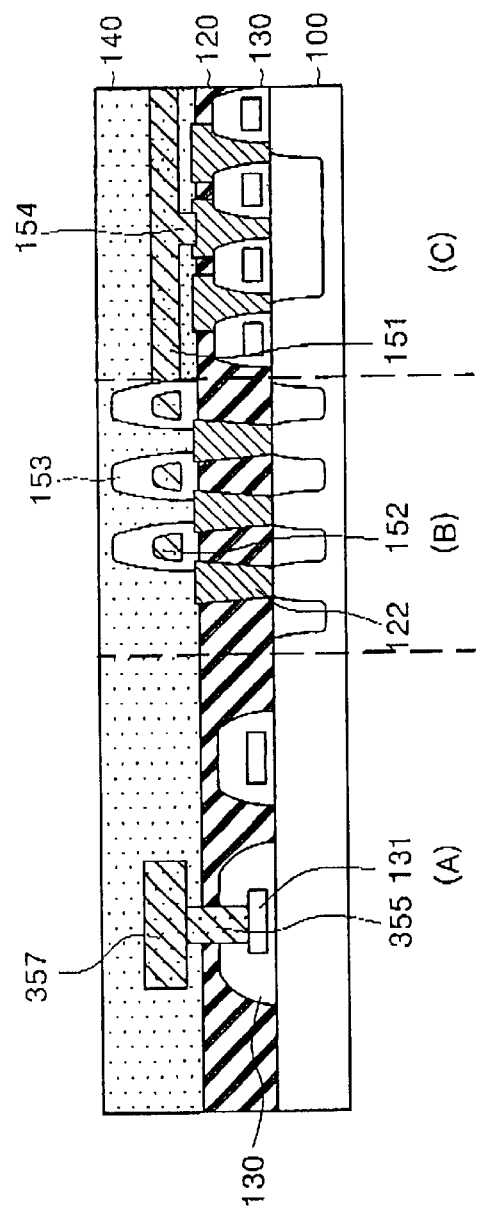

METHOD FOR FABRICATING OF SEMICONDUCTOR MEMORY DEVICE HAVING A METAL PLUG OR A LANDING PAD

BACKGROUND OF THE INVENTION

1. Field of the Invention

The present invention relates to a semiconductor memory device and a method of fabricating the same and, more particularly, to a dynamic random access memory (DRAM) having a metal plug.

2. Description of the Related Art

As the degree of integration of semiconductor memory devices such as a dynamic random access memory (DRAM) device increases, design rules and fabricating margins are generally reduced. Even with such reduction, capacitor capacitance should be maintained to operate the DRAM devices.

To provide a suitable capacitance, a capacitor having a three-dimensional configuration has been developed for increasing the capacitance per unit area. In such a configuration, a trench type capacitor, a stack type capacitor, and a trench and stack combined type capacitor have been proposed. The stack type capacitor is widely used because it utilizes conventional fabrication technology. In particular, a stack type capacitor having a capacitor over bit line (COB) is most widely used so as to easily increase the effective area of the capacitor.

Generally, the stack type capacitor has a storage electrode pad (or buried contact plug) formed of a doped polysilicon layer, and the pad is usually shaped in a narrow and long pillar. The resistance between a storage electrode of the capacitor formed over the storage electrode pad and a source in a semiconductor substrate is high, and read/write data transmitting therethrough can be delayed. Additionally, as dopants of the doped polysilicon diffuse to the semiconductor substrate (which is called an out-diffusion phenomena), an efficient channel distance of a transistor formed between a source and a drain of the semiconductor substrate is reduced, thereby deteriorating operating characteristics of the transistor.

An inter-layer pathway, referred to in the art as a "plug" or "stud" is generally included in highly integrated devices for electrically coupling between the various active devices and transmission lines. To assist in aligning a plug, "landing pads" is formed in lower parts to serve as a target for the plugs passing from the upper layer. The landing pads are coupled to an underlying circuit or interconnect, and the landing pads are typically formed of metal. Thus, the process for fabricating the plug or stud is complex. For example, when the doped polysilicon layer is used as a storage electrode pad of the capacitor, the landing pad and the plug cannot be simultaneously fabricated with the doped polysilicon layer.

Accordingly, a need exists for an improved method for forming a semiconductor memory device having a metal plug or a landing pad. A need also exists for a DRAM device having a high aspect ratio with reference to the height of a hole as compared to its width for minimizing signal transmission delay.

SUMMARY OF THE INVENTION

A semiconductor memory device is provided, which includes a first insulating layer having a gate electrode on a semiconductor substrate; a second insulating layer formed on the first insulating layer, the second insulating layer having bit lines covered with bit line isolation layers, buried contact plugs formed between the bit lines, and a first metal contact plug connected to the semiconductor substrate through the first insulating layer; a silicon nitride layer on the second insulating layer; and a third insulating layer formed on the silicon nitride layer, the third insulating layer having a second metal contact plug connected to the first metal contact plug through the silicon nitride layer.

According to an embodiment of the present invention, the second insulating layer further includes a first landing stud connected to the gate electrode through the first insulting layer. The bit lines include a direct contact plug under one of the bit line. The first landing stud is simultaneously formed with the direct contact plug.

According to an embodiment of the present invention, the second insulating layer further includes a second landing stud on the first landing stud. The second landing stud is larger in surface area than the first landing stud. The first metal contact plug and the buried contact plugs are simultaneously formed with an electrical conducting material. The electrical conducting material includes tungsten (W). The third insulating layer further includes a metal-insulator-metal capacitor on the buried contact plug.

A method of fabricating a semiconductor memory device is also provide, which includes the steps of: forming a gate electrode on a silicon substrate, the silicon substrate being divided into a cell area and a peripheral area, and the gate electrode having a gate and a gate spacer being covered with the gate; forming a first inter-layer dielectric layer (ILD1) on the silicon substrate having the gate electrode; forming a cell pad poly between the gate electrodes in the cell area; forming a direct contact plug (DC) on the cell pad poly in the cell area, and a first landing stud on the gate in the peripheral area; forming a bit line on the DC in the cell area and a second landing stud on the first landing stud, the bit line being covered with a bit line isolation layer; forming a second inter-layer dielectric layer (ILD2) on the ILD1 having the bit line to cover the bit line isolation layer; forming a silicon nitride layer on the ILD2; patterning the silicon nitride layer; etching out a portion of the ILD2 in the cell area using the patterned silicon nitride layer and the bit line isolation layer as etching blocking layers until the cell pad poly is exposed, and simultaneously etching out a portion of the ILD2 and a portion of the ILD1 in the peripheral area using the patterned silicon nitride layer; and simultaneously forming a plurality of buried contact plugs in the cell area and a first metal contact plug in the peripheral area by filling electrically conducting material to the etching portions of the ILD1 and ILD2.

According to an embodiment of the present invention, the cell pad poly is impurity doped polysilicon. The DC and the first landing stud include tungsten (W). The bit line and the second landing stud include tungsten (W). The plurality of buried contact plugs and the first metal contact plug are formed of tungsten (W). The silicon nitride layer is formed of $Si_3N_4$.

According to an embodiment of the present invention, the method further includes the steps of: forming a third inter-layer dielectric layer (ILD3) on the silicon nitride layer; patterning the ILD3 to expose the buried contact plug; and forming a metal-insulator-metal (MIM) capacitor on the buried contact plug; planarizing the ILD3 before forming the patterning the ILD3.

According to an embodiment of the present invention, the step of forming the MIM capacitor includes the steps of:

forming a storage electrode on the silicon nitride layer; forming a insulating layer on the storage electrode; and forming a floating electrode on the insulating layer. The storage electrode is formed of tungsten (W). The method further includes the steps of: forming a fourth inter-layer dielectric layer (ILD4) on the ILD3 having the MIM capacitor; patterning a portion of ILD4 and a portion of ILD3 to expose the MC0, patterning a portion of the ILD4, a portion of ILD3, and a portion of ILD2 to expose the second landing stud, and patterning a portion of the ILD4 to expose the MIM capacitor; and forming a second metal contact plug to connect to the MC0, the second landing stud, and MIM capacitor. The second metal contact plug is formed of tungsten.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which:

FIGS. 1 to 5 are sequential cross sectional diagrams illustrating fabrication processes of a semiconductor memory device having a COB structure of a metal-insulator-metal (MIM) capacitor according to a preferred embodiment of the present invention.

DETAILED DESCRIPTION OF PREFFERED EMBODIMENTS

Figure 3:
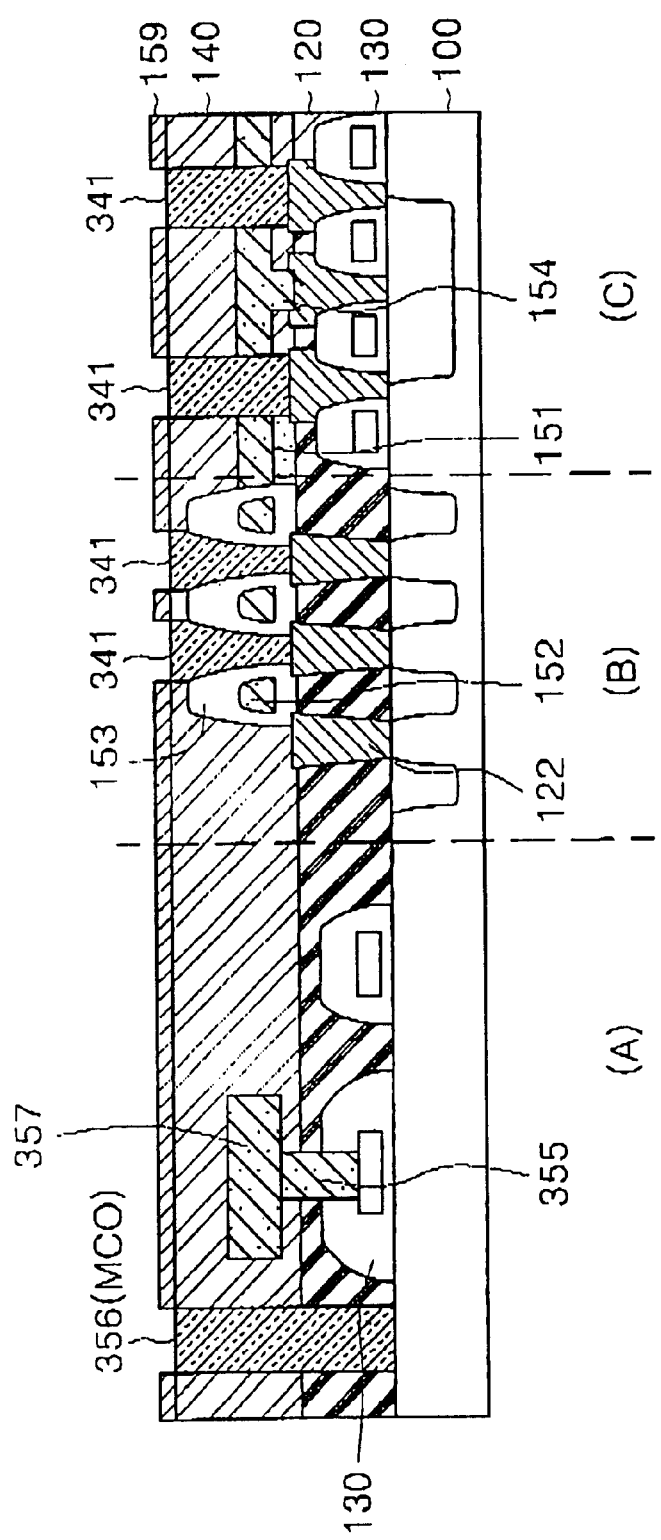

Reference will now be made in detail to preferred embodiments of the present invention, example of which is illustrated in the accompanying drawings.

FIGS. 1 to 5 are sequential cross sectional diagrams illustrating fabricating processes of a semiconductor memory device having cell and peripheral areas according to a preferred embodiment of the present invention.

Referring to FIG. 1, field regions 101 and active regions 102 are formed in a semiconductor substrate. Gate electrodes 130 having a gate 131 covered with a gate spacer 132 are formed on the silicon substrate 100. A symbol "A" denotes a peripheral area, a symbol "B" denotes a cell area, and a symbol "C" denotes a cell area in an orthogonal direction to the symbol Next, a first inter-layer dielectric layer (ILD1) 120 is formed on the substrate 100 having the gate electrode 130. Preferably, the ILD1 120 is formed of $SiO_2$. Next, the ILD1 120 is preferably planarized by a chemical mechanical polishing (CMP) process. After planarizing the ILD1 120, predetermined portions of the ILD1 are etched out by dry etching. Preferably, the etching is performed on the active regions of the silicon substrate 100 and between the gate electrode 130.

Next, a polysilicon (not shown) is formed to fully cover the etched portions of the ILD1. According to an embodiment of the present invention, the polysilicon includes an impurity doped polysilicon. Next, the polysilicon is planarized until the ILD1 120 is exposed to form cell poly pads 122 between the gate electrodes 130. As shown in FIG. 1, the cell poly pads 122 are formed on the active region 102 in the cell area B, and formed between the gate electrodes 130 in the cell area C.

Referring to FIG. 2, insulating material (not shown) is formed on the ILD1 120, and the insulating material is patterned to expose a portion of the cell pad poly 122 in the cell area C or B and a portion of the gate 131 in the peripheral area A. Next, a conducting metal (not shown) is deposited to fill the exposed cell pad poly 122 in the cell area C or B and the portion of the gate 131 in the peripheral area A. Then, the conducting metal is planarized until the insulating material is exposed to form a direct contact plug (DC) 154 in the cell area and a first landing stud 355 in the peripheral area. The first landing stud 355 is to electrically couple with gate 131 in the peripheral area A. According to an embodiment of the present invention, the conducting metal preferably includes tungsten (W).

After removing the insulating material, bit lines 151 and 152 are formed on the DC 154, and a second landing stud 357 is formed on the first landing stud 355. According to an embodiment of the present invention, the bit lines 151 and 152, and the second landing stud 357 are simultaneously formed with the same material. According to an embodiment of the present invention, the second landing stud 357 is larger in surface area than the first landing stud 355 to serve as a wider-tolerance target for the next plugging process. Preferably, the bit lines 151 and 152, and the second landing stud 357 includes tungsten (W). After forming the bit lines 151 and 152, a bit line isolation layer 153 is formed to cover the bit line 152.

Next, a second inter-layer dielectric layer (ILD2) 140 is formed on ILD1 120 to fully cover the bit lines 151 and 152 and the first and second landing studs 355 and 357, and then planarized by a chemical mechanical polishing process.

Referring to FIG. 3, after forming the ILD2 140, a silicon nitride layer 159 such as a $Si_3N_4$ layer is deposited on the ILD2 140. Next, the silicon nitride layer 159 is patterned by a photolithography process and etched out predetermined portions of ILD2 140 in the cell area B using a self-aligned contact method until the cell pad poly 122 is exposed. Fabricating margin is very small in the cell area B, the bit line isolation layer 153 and the cell pad poly 122 are used as etching stopping layers, thereby securing the bit line 152 during etching out the predetermined portions of ILD2 140. In the peripheral area A, a predetermined portion of the ILD2 and the ILD1 is simultaneously etched out to form a first metal contact hole (not shown) until the active region of the silicon substrate 100 is exposed by using the patterned silicon nitride layer 159 as a mask. According to an embodiment of the present invention, the etching is preferably performed by a dry etching process with high selectivity to the ILD2 140 and the ILD1 120.

Next, an electrically conducting metal (not shown) is deposited to fully fill the etched portions. Next, the electrical conducing metal is planarized by a chemical mechanical polishing (CMP) process or an etching back process until the silicon nitride layer 159 is exposed. Then, a buried contact (BC) 341 in the cell area B and a first metal contact plug (MC0) 356 in the peripheral area A are formed. According to an embodiment of the present invention, the electrical conducting material is preferably formed of tungsten (W).

Figure 4:
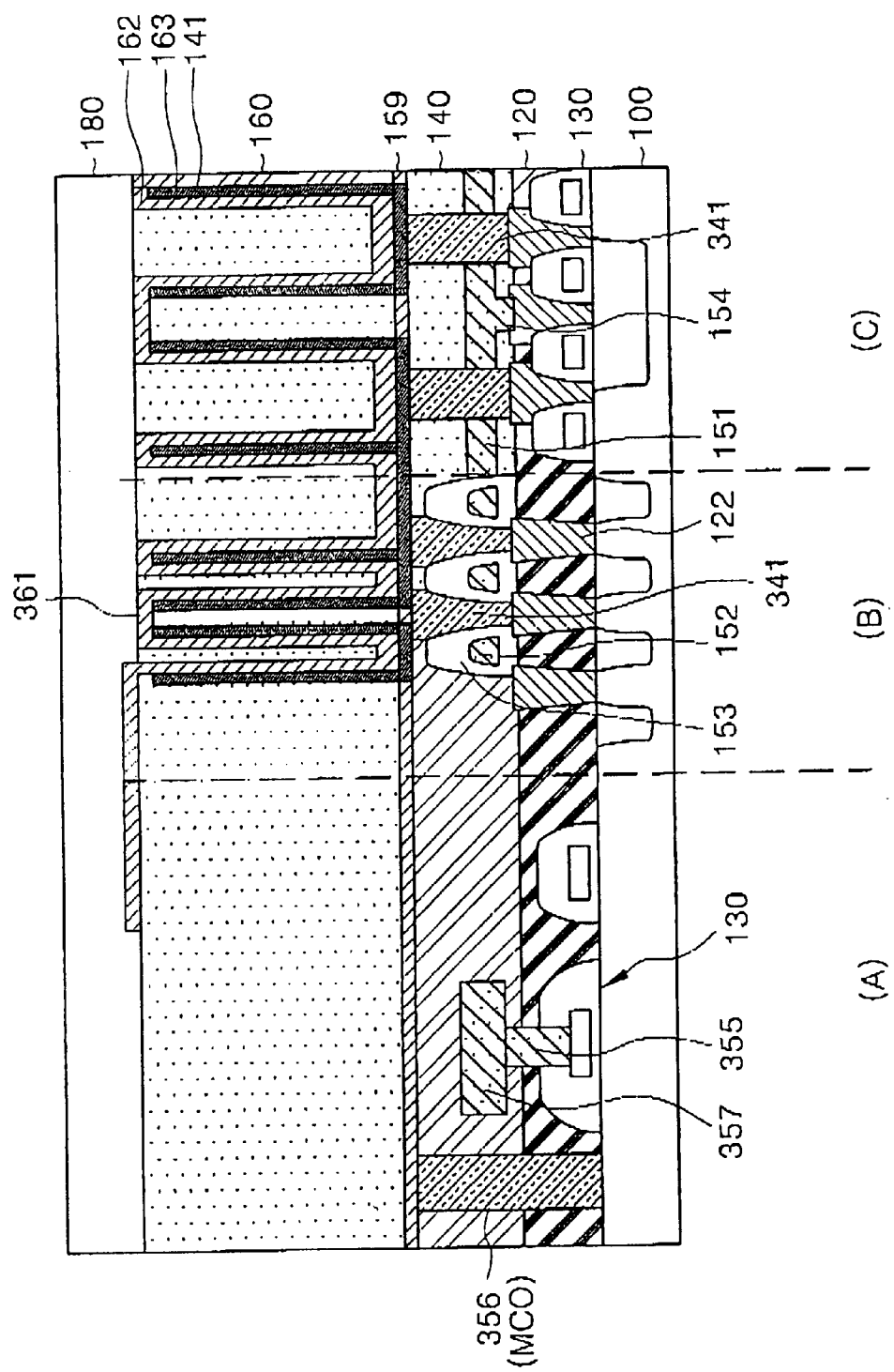

Referring to FIG. 4, a third inter-layer dielectric layer (ILD3) 160 is formed on the silicon nitride layer 159, the BC 341, and the MC0 356. Next, the ILD3 160 is patterned and a metal-insulator-metal (MIM) capacitor 361 is formed on the BC 341 in the patterned ILD3. According to an embodiment of the present invention, the MIM capacitor 361 includes a storage electrode 141, a dielectric layer 163, and a floating electrode 162. The storage electrode 141 is formed of any metal which can be formed of an ohmic contact to BC 341 metal. Preferably, the storage electrode 141 is formed of tungsten (W).

Next, a fourth inter-layer dielectric layer (ILD4) 180 is formed on the ILD3 160 having the MIM capacitor 361 and planarized.

Figure 5:
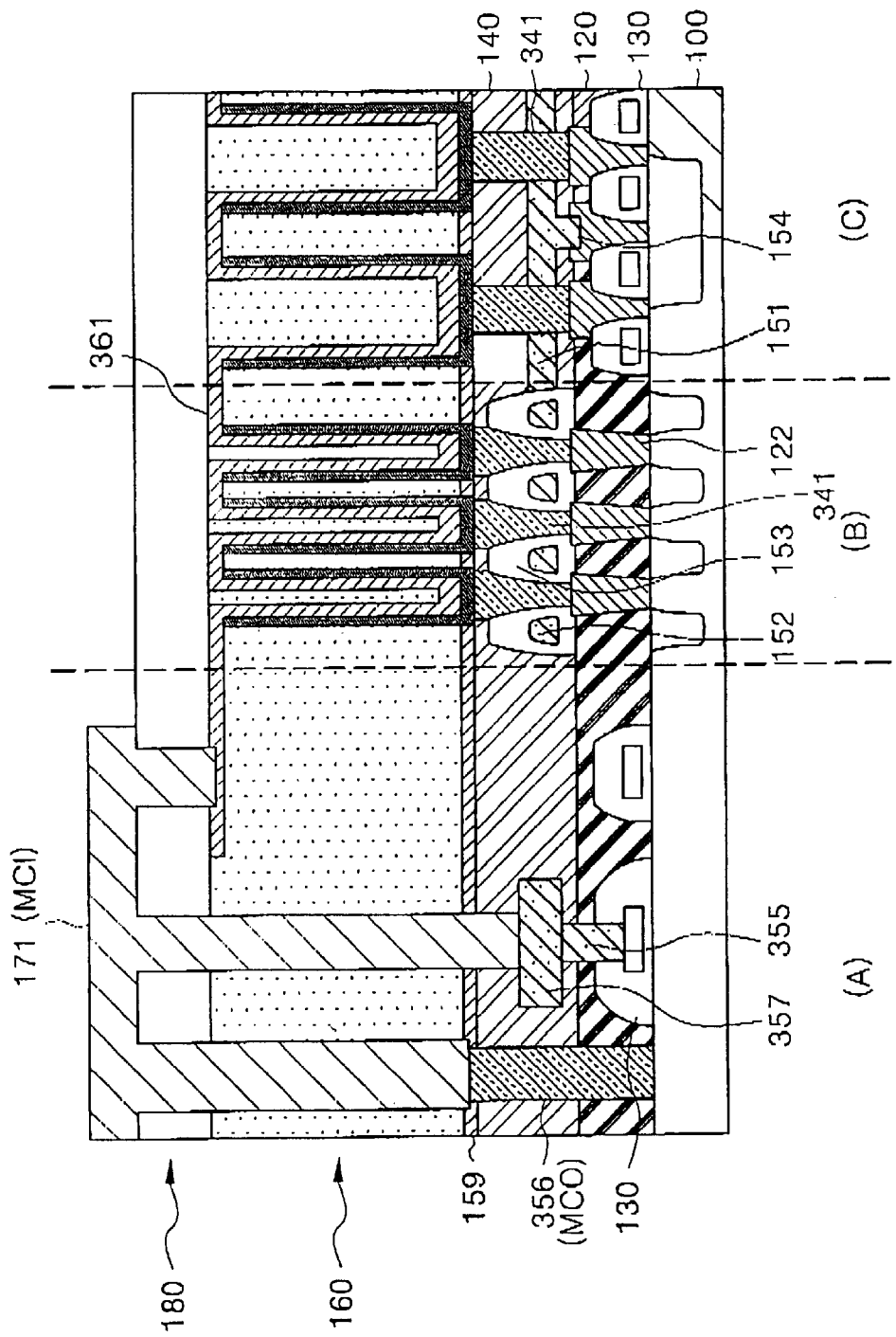

Referring to FIG. 5, predetermined portions of ILD4 180 and ILD3 160 in the peripheral area A are sequentially etched out to expose the MC0 356, the second landing stud 357, and the MIM capacitor 361 by using a dry etching method. The dry etching is performed through multi-steps. First dry etching is performed to expose the floating electrode 162. Second dry etching is performed to expose the MC0 356 until the silicon nitride layer 159 formed of the $Si_3N_4$ layer is detected as an indicator. The silicon nitride layer 159 has an advantage in enlarging the etching process margin. Further, third dry etching is consecutively performed to expose the second landing stud 357 using a low selectivity or low/high mixed selectivity to the second landing stud 357.

Next, a second electrical conducting material is formed on the ILD4 180 to fully fill the etched portions of ILD4 180, ILD3 160, and ILD2 140. The second electrical conducting material is planarized to form a second metal contact plug (MC1) 171. According to an embodiment of the present invention, the MC1 171 is preferably formed with Tungsten (W).

According to an embodiment of the present invention, the buried contact (BC) 341 and the first metal contact plug (MC0) 356 are simultaneously formed with a metal instead of polysilicon. Thus, the resistance of the BC 341 and the MC0 356 is largely reduced, out-diffusion of dopant from the BC 341 and the MC0 356 is virtually eliminated because the BC 41 and the MC0 356 do not have dopant sources such as impurities, and the fabrication process is simplified. Additionally, as metal contact plugs (MC0 and MC1) and landing studs are fabricated with two steps, a semiconductor device having a very high aspect ratio is easily accomplished.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A method of fabricating a semiconductor memory device, comprising the steps of:

forming a gate electrode on a silicon substrate, the silicon substrate being divided into a cell area and a peripheral area, and the gate electrode having a gate and a gate spacer being covered with the gate;

forming a first inter-layer dielectric layer (ILD1) on the silicon substrate having the gate electrode;

forming a cell pad poly between the gate electrodes in the cell area;

forming a direct contact plug (DC) on the cell pad poly in the cell area, and a first landing stud on the gate in the peripheral area;

forming a bit line on the DC in the cell area and a second landing stud on the first landing stud, the bit line being covered with a bit line isolation layer;

forming a second inter-layer dielectric layer (ILD2) on the ILD1 having the bit line to cover the bit line isolation layer;

forming a silicon nitride layer on the ILD2;

patterning the silicon nitride layer;

etching out a portion of the ILD2 in the cell area using the patterned silicon nitride layer and the bit line isolation layer as etching blocking layers until the cell pad poly is exposed, and simultaneously etching out a portion of the ILD2 and a portion of the ILD1 in the peripheral area using the patterned silicon nitride layer; and simultaneously forming a plurality of buried contact plugs in the cell area and a first metal contact plug in the peripheral area by filling electrically conducting material to the etching portions of the ILD1 and ILD2.

2. The method of claim 1, wherein the cell pad poly is impurity doped polysilicon.

3. The method of claim 1, wherein the DC and the first landing stud includes tungsten (W).

4. The method of claim 1, wherein the bit line and the second landing stud includes tungsten (W).

5. The method of claim 1, wherein the plurality of buried contact plugs and the first metal contact plug are formed of tungsten (W).

6. The method of claim 1, wherein the silicon nitride layer is formed of $Si_3N_4$.

7. The method of claim 1, wherein the second landing stud is larger in surface area than the first landing stud.

8. The method of claim 1, further comprising the step of planarizing the ILD2 before forming the silicon nitride layer.

9. The method of claim 1, further comprising the steps of:

forming a third inter-layer dielectric layer (ILD3) on the silicon nitride layer;

patterning the ILD3 to expose the buried contact plug; and forming a metal-insulator-metal (MIM) capacitor on the buried contact plug.

10. The method of claim 9, further comprising the step of planarizing the ILD3 before forming the patterning the ILD3.

11. The method of claim 10, wherein the step of forming the MIM capacitor comprises the steps of:

forming a storage electrode on the silicon nitride layer;

forming a insulating layer on the storage electrode; and forming a floating electrode on the insulating layer.

12. The method of claim 11, wherein the storage electrode is formed of tungsten (W).

13. The method of claim 9, further comprising the steps of:

forming a fourth inter-layer dielectric layer (ILD4) on the ILD3 having the MIM capacitor;

patterning a portion of ILD4 and a portion of ILD3 to expose the MC0, patterning a portion of the ILD4, a portion of ILD3, and a portion of ILD2 to expose the second landing stud, and patterning a portion of the ILD4 to expose the MIM capacitor; and forming a second metal contact plug to connect to the MC0, the second landing stud, and MIM capacitor.

14. The method of claim 13, wherein the second metal contact plug is formed of tungsten.

* * * * *